United States Patent
Suzuki

Patent Number: 5,256,918
Date of Patent: Oct. 26, 1993

[54] PROGRAMMABLE LOGIC CIRCUIT

[75] Inventor: Hiroaki Suzuki, Yokohama, Japan

[73] Assignee: Kabushiki Kaisha Toshiba, Kawasaki, Japan

[21] Appl. No.: 838,889

[22] Filed: Feb. 21, 1992

[30] Foreign Application Priority Data

Feb. 27, 1991 [JP] Japan .................. 3-32979

[51] Int. Cl.⁵ ............................. H03K 19/173
[52] U.S. Cl. ........................ 307/465; 307/468
[58] Field of Search ........... 307/465, 465.1, 468-469

[56] References Cited

U.S. PATENT DOCUMENTS

| | | | |
|---|---|---|---|
| 4,796,229 | 1/1989 | Greer, Jr. | 307/465 |
| 4,876,466 | 10/1989 | Kondou et al. | 307/465 |
| 5,132,570 | 7/1992 | Shoutou | 307/468 |

Primary Examiner—Edward P. Westin
Assistant Examiner—Andrew Sanders
Attorney, Agent, or Firm—Finnegan, Henderson, Farabow, Garrett & Dunner

[57] ABSTRACT

A programmable logic circuit has a data transfer circuit, fundamental programmable logic circuits, programmable wiring circuits, a decoder circuit, and an input/output circuit. The data transfer circuit outputs serial program data in a parallel manner. Each of the fundamental programmable logic circuits includes first data storage sections arranged in a matrix pattern. The signal output states of these first data storage sections are programmed in accordance with parallel data supplied from the data transfer circuit, and a logic circuit pattern is programmed in accordance with at least outputs of the first data storage sections. The programmable wiring circuits are arranged in adjacent to the fundamental programmable logic circuits and provide connection lines between the fundamental programmable logic circuits. Each of the programmable wiring circuits includes second data storage sections arranged in a matrix pattern. The signal output states of these second data storage sections are programmed in accordance with the parallel data supplied from the data transfer circuit, and switches located between the connection lines are selected or controlled in accordance with outputs of the second storage sections. The decoder circuit causes the first and second storage sections to store data output from the data transfer circuit in response to address designation.

8 Claims, 6 Drawing Sheets

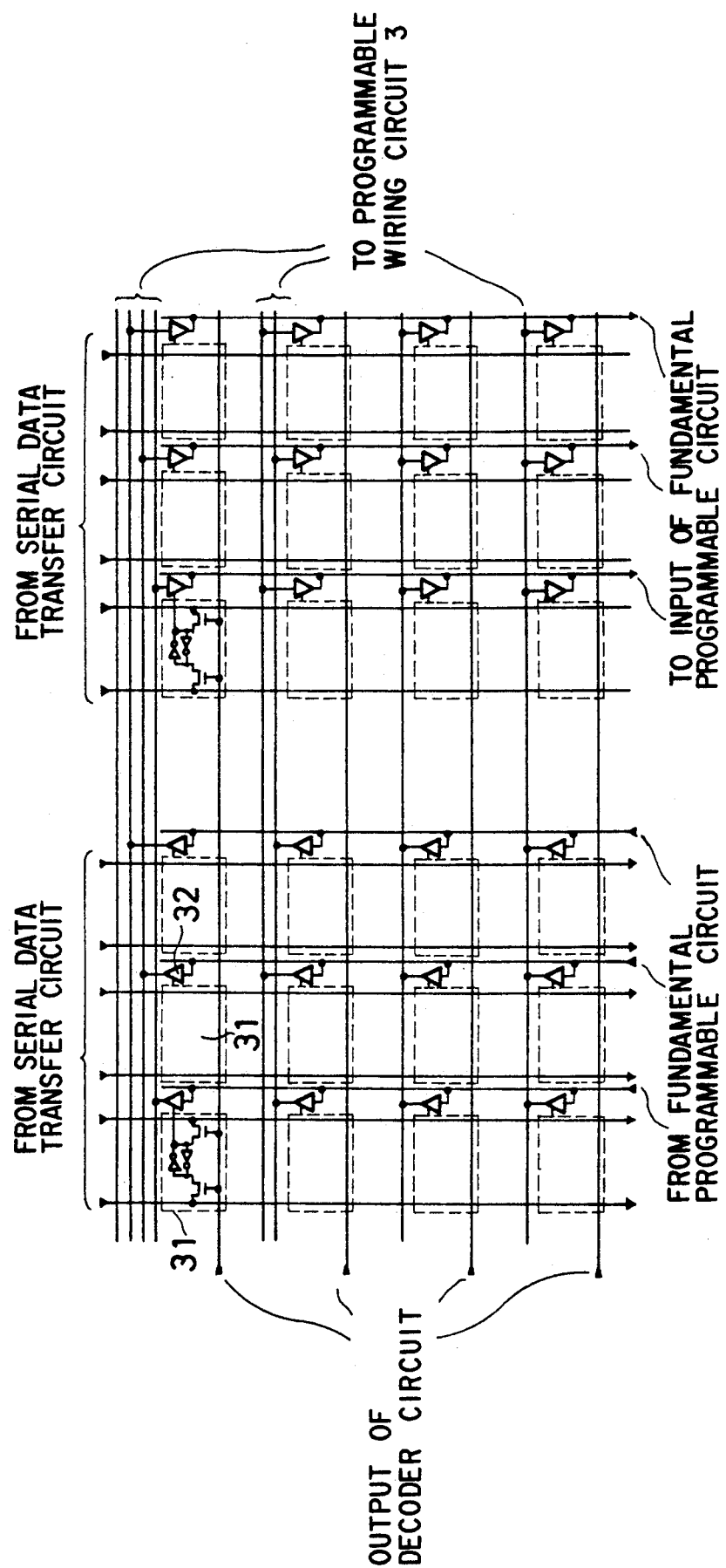
F I G. 5

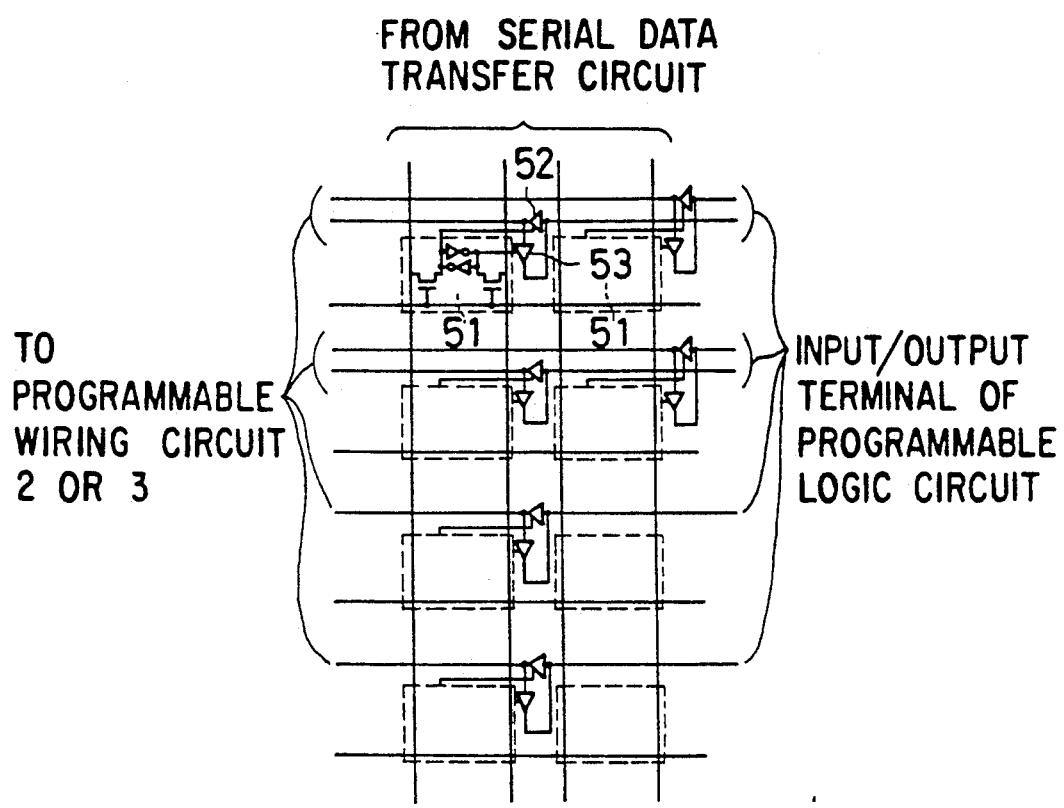
F I G. 7

PROGRAMMABLE LOGIC CIRCUIT

BACKGROUND OF THE INVENTION

1. Field of the Invention

The present invention relates to a programmable logic circuit, and more particularly to a programmable logic circuit incorporated in a programmable logic device which employs a flip-flop circuit as a programmable circuit element.

2. Description of the Related Art

Conventionally, an LCA (logic cell array) is known as an LSI (large-scale integrated circuit) that enables the preparation of a desirable logic circuit. In the LCA, programmable fundamental circuits are arranged in a matrix pattern on a semiconductor chip, and programmable mutual wiring lines are connected between the fundamental circuits. Switching elements are provided between the respective mutual wiring lines. Data is written in each RAM cell on the semiconductor chip, externally of the semiconductor chip. With each switching element being controlled in accordance with that data, a desirable logic circuit pattern is programmed on the semiconductor chip. The fundamental circuits are formed at different positions from those of the RAM cells and are therefore independent of the RAM cells. The programming of the LSI by the RAM cells is merely to change the manner of connection of the wiring lines by means of the switching elements.

One general problem of a complicated logic device incorporating field-programmable devices (i.e., devices programmable by the user) is that a desirable logic circuit pattern cannot be easily mapped or programmed for each field-programmable device.

In general, a desirable logic circuit pattern is made by a combination of inverters, NAND circuits, NOR circuits, flip-flop circuits and other various logic elements. However, it is difficult to program such various logic circuit elements in a field-programmable device. Thus, a logic itself is subjected to equivalent logic conversion by using the fundamental circuit prepared for the field-programmable device, and mapping is performed with respect to the fundamental circuit of the device in accordance with the logic obtained by the conversion. At the time, the fundamental circuits have to be connected to each other by arranging the mutual wiring lines in accordance with logic connection data.

All of the procedures mentioned above cannot be manually performed in practice, and therefore have to be subjected to computer processing. Therefore, whether or not it is easy to develop the software program for that computer processing is a matter of importance. In other words, whether or not it is easy to perform mapping for each field-programmable device is a matter of importance.

Another general problem of the logic device is that the operation speed of the device is not very high. More specifically, since the wiring connection is programmable, one connection line of a logic circuit is formed by means of a plurality of metal lines and switching elements in an actual device. Due to the parasitic resistance of the switching circuit, the signal transmission on the connection line is inevitably delayed, lowering the operation speed of the entire device. Therefore, how to reduce the resistance of each connection line is also a matter of importance.

Further, from the viewpoint of cost, it is desirable that a device programmed to have an intended logic circuit be as simple as possible. In general, a programmable device incorporates many redundant circuit elements because of its programmability. Therefore, a logic circuit programmed by the programmable device is large in circuit scale, in comparison with the case where a logic circuit having the same function is attained by means of gate arrays and standard cells. If the logic circuit is large in circuit scale, a large-sized chip will be required for fabricating an LSI, resulting in a high manufacturing cost.

SUMMARY OF THE INVENTION

The present invention has been conceived to solve the problems mentioned above, and its object is to provide a highly-integrated programmable logic circuit which enables easy mapping of a desirable logic circuit pattern and permits a programmed connection line to have a low parasitic resistance.

To achieve the object, the programmable logic circuit of the present invention comprises:

a data transfer circuit for outputting serial program data in a parallel manner;

a plurality of fundamental programmable logic circuits each including first data storage sections arranged in a matrix pattern, the signal output states of the first data storage sections being programmed in accordance with parallel data supplied from the data transfer circuit, a logic circuit pattern being programmed in accordance with at least outputs of the first data storage sections;

a plurality of programmable wiring means, arranged in adjacent to the fundamental programmable logic circuits, for providing connection lines between the fundamental programmable logic circuits, the programmable wiring means including second data storage sections arranged in a matrix pattern, the signal output states of the second data storage sections being programmed in accordance with the parallel data supplied from the data transfer circuit, and switches located between the connection lines being selected or controlled in accordance with outputs of the second storage sections;

a decoder circuit for causing the first and second storage sections to store data output from the data transfer circuit in response to address designation; and an input/output circuit for receiving and outputting a signal supplied through the fundamental programmable logic circuits and the programmable wiring means, at least the fundamental programmable logic circuits and the programmable wiring means being arranged in a matrix pattern.

According to the present invention, the fundamental programmable logic circuits are limited to circuits arranged in a matrix pattern, as in a PAL (programmable array logic), a PLA (programmable logic array) or a ROM. The storage elements in which program data is written are made by such data storage sections as are exemplified by flip-flop circuits, and are arranged in a matrix pattern. By use of the outputs of the storage elements, the fundamental programmable logic circuits are programmed to have an intended logic pattern in such a manner that the logic circuits constitute part of an LSI. Further, the programmable wiring circuits adjacent to the fundamental programmable logic circuits have their data storage sections arranged in a matrix pattern, and the switches located between connection lines are controlled in accordance with the data stored in the data storage sections, so as to provide part of the connection lines of the LSI. The logic circuits and the connection lines, both parts of the LSI, are treated as one circuit element. The entirety of the LSI is made by arranging such circuit elements in a matrix pattern. By arranging both the circuit structure to be programmed and the circuit structure for programming that circuit structure in an overlap manner, the entire structure can be made as simple as possible, so as to improve the mapping characteristics of a desirable logic circuit, reduce the resistance of a connection line, and enhance the integration. The enhancement of integration is achieved by miniaturizing data write circuits and wiring lines. The present invention differs from the conventional LCA, in that the fundamental programmable logic circuits, the programmable wiring circuits and the data storage sections (e.g., flip-flop circuits for storing program data) are connected directly to one another.

Additional objects and advantages of the invention will be set forth in the description which follows, and in part will be obvious from the description, or may be learned by practice of the invention. The objects an advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 to 7 are detailed circuit diagrams, each showing part of the circuit arrangement depicted in FIG. 1.

DETAILED DESCRIPTION OF THE PREFERRED EMBODIMENTS

Figure 1:
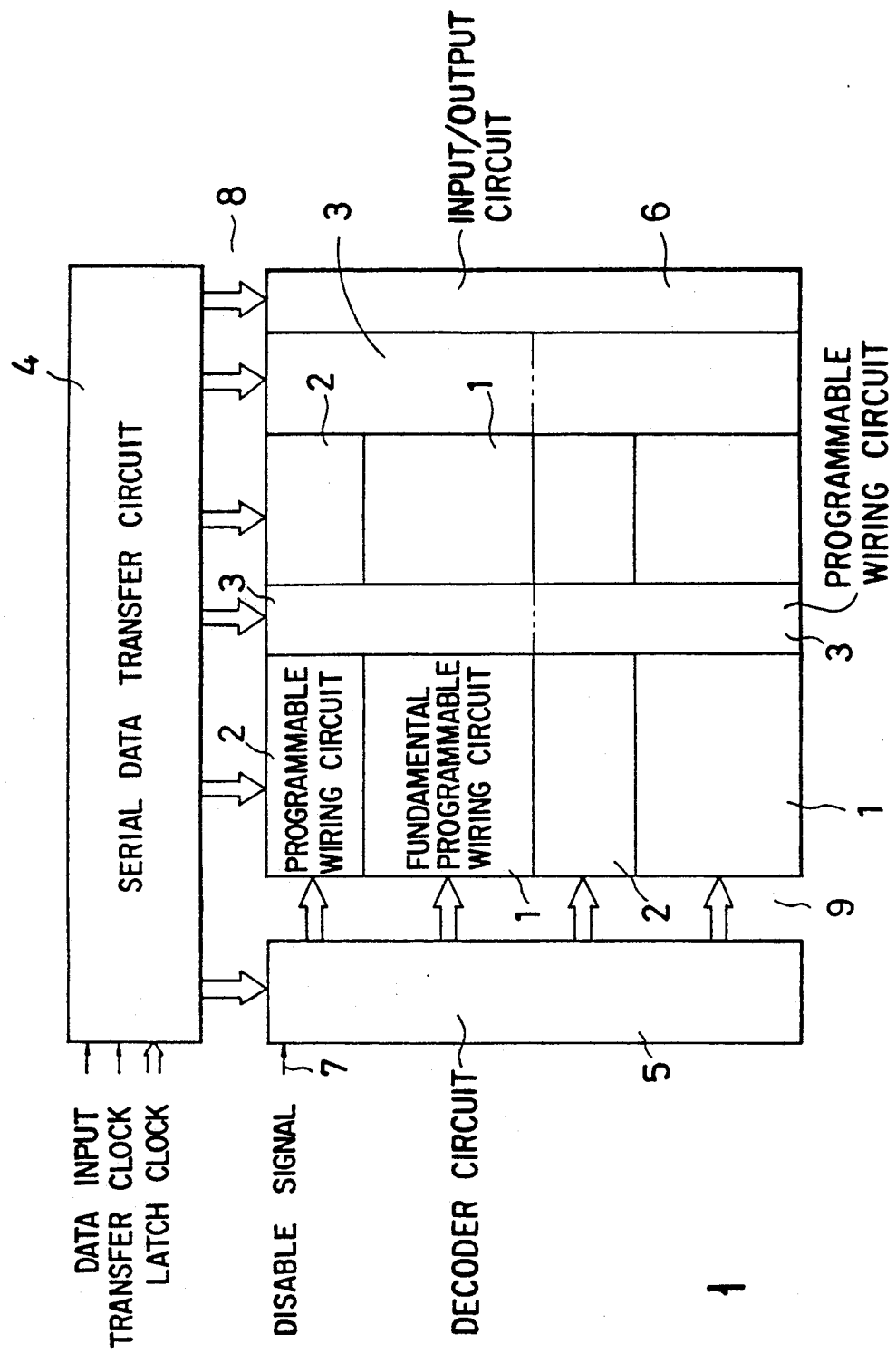
FIG. 1 shows the entire circuit arrangement according to one embodiment of the present invention.

FIG. 1 illustrates one embodiment of the present invention. As is shown in FIG. 1, the major structural components of the embodiment include: fundamental programmable logic circuits 1; programmable wiring circuits 2 and 3; a data transfer circuit 4 for serially transferring program data to the fundamental programmable logic circuits 1, the wiring circuits 2 and 3; a decoder circuit 5 for receiving address data which is included in the data transferred by the data transfer circuit 4 and is used for writing program data, decoding the address data, and setting address areas of programmable circuits 1-3 in a data write state; and an input/output circuit 6 for receiving input signals and outputting signals which the circuits 1-3 has generated upon performing logic operation on the input signal.

The decoder circuit 5 has a disable terminal 7 which disables an output of the data transfer circuit 4 during a data write time. The transfer circuit 4 has parallel output lines 8 which extend in the columnar direction, as indicated in FIG. 1, while the decoder circuit 5 has parallel output lines 9 which extend in the row direction, as indicated in FIG. 1. By means of the parallel output lines 8 and 9, the programmable circuits 1-3 are programmed. In FIG. 1, each programmable wiring circuit 3 is depicted by the two-dot-and-dash lines as being divided in the columnar direction, but actually it is not divided. The programmable circuits 1-3, which are adjacent to one another, jointly constitute one unit, and a plurality of such programmable circuit units are arranged in a matrix pattern.

Figure 2:
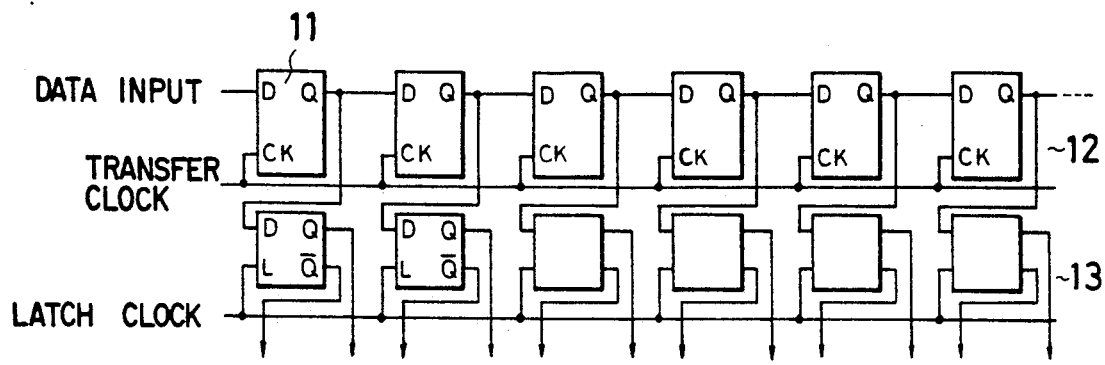
FIG. 2 is a detailed circuit diagram showing part of the circuit arrangement depicted in FIG. 1.
Figure 3:
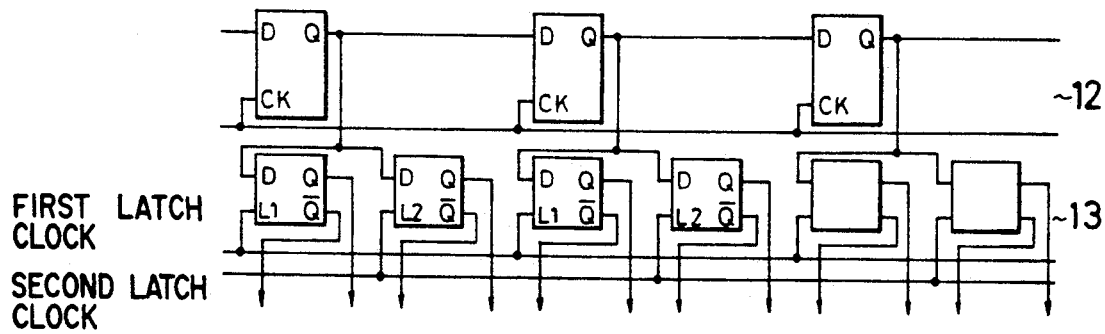
FIG. 3 is a circuit diagram showing a modification of the circuit arrangement depicted in FIG. 2.

FIGS. 2 and 3 each show an example of the data transfer circuit 4. As is shown in these Figures, the data transfer circuit 4 comprises D-type flip-flop circuits 11 arranged in series. A shift register 12 for serially transferring data and a latch circuit 13 for latching data in synchronism with the end of the data shifting are connected to the flip-flop circuits 11 in units of one bit. In the case of the circuit arrangement shown in FIG. 2, the latch circuit 13 may be omitted, if a consumption power increase due to frequent variations in the transferred output signal does not become a problem. In the case of the circuit arrangement shown in FIG. 3, the number of bits provided for the shift register 12 is reduced, and the data corresponding to the address data which the decoder 5 produces at one time is divided into two data pieces. The two data pieces are transferred in two steps, and are latched in two steps by use of first and second latch clocks.

The decoder circuit 5 is an ordinary type. To be more specific, one of the output terminals of the decoder circuit 5 is selectively set in an active state, and the data which the decoder circuit 5 receives from the data transfer circuit 4 is written in the flip-flop circuits corresponding to the active-state output terminal. In order to easily execute the data-writing operation, it is desirable that the decoder circuit 5 have an enable or disable function. In the present embodiment, the data input to the decoder 5 is supplied from the data transfer circuit 4, but since the number of input lines required is not very large, the data to be input to the decoder can be supplied from an external circuit of the programmable logic circuit, without adversely affecting the advantages of the present invention.

Figure 4:
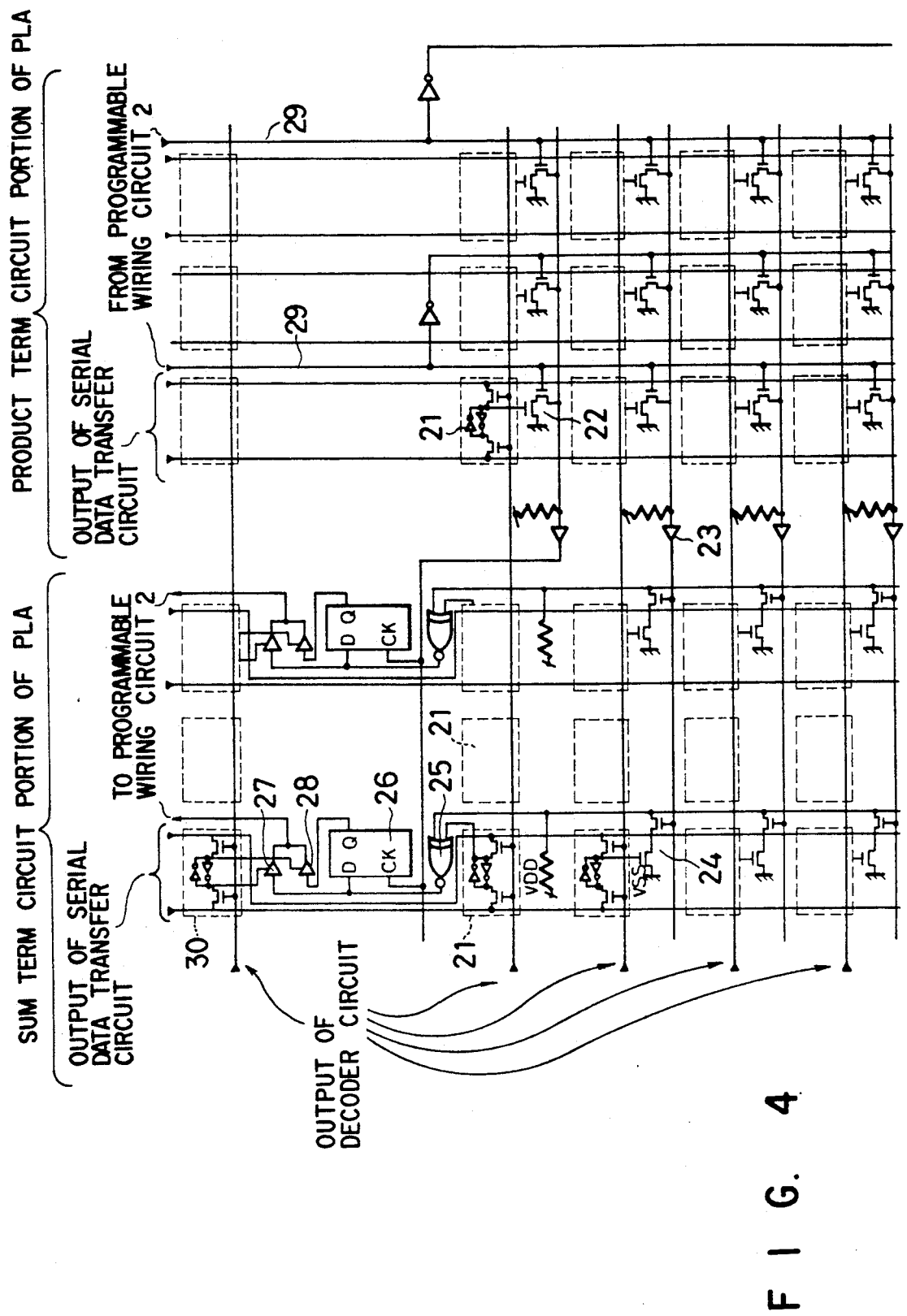
Figure 6:
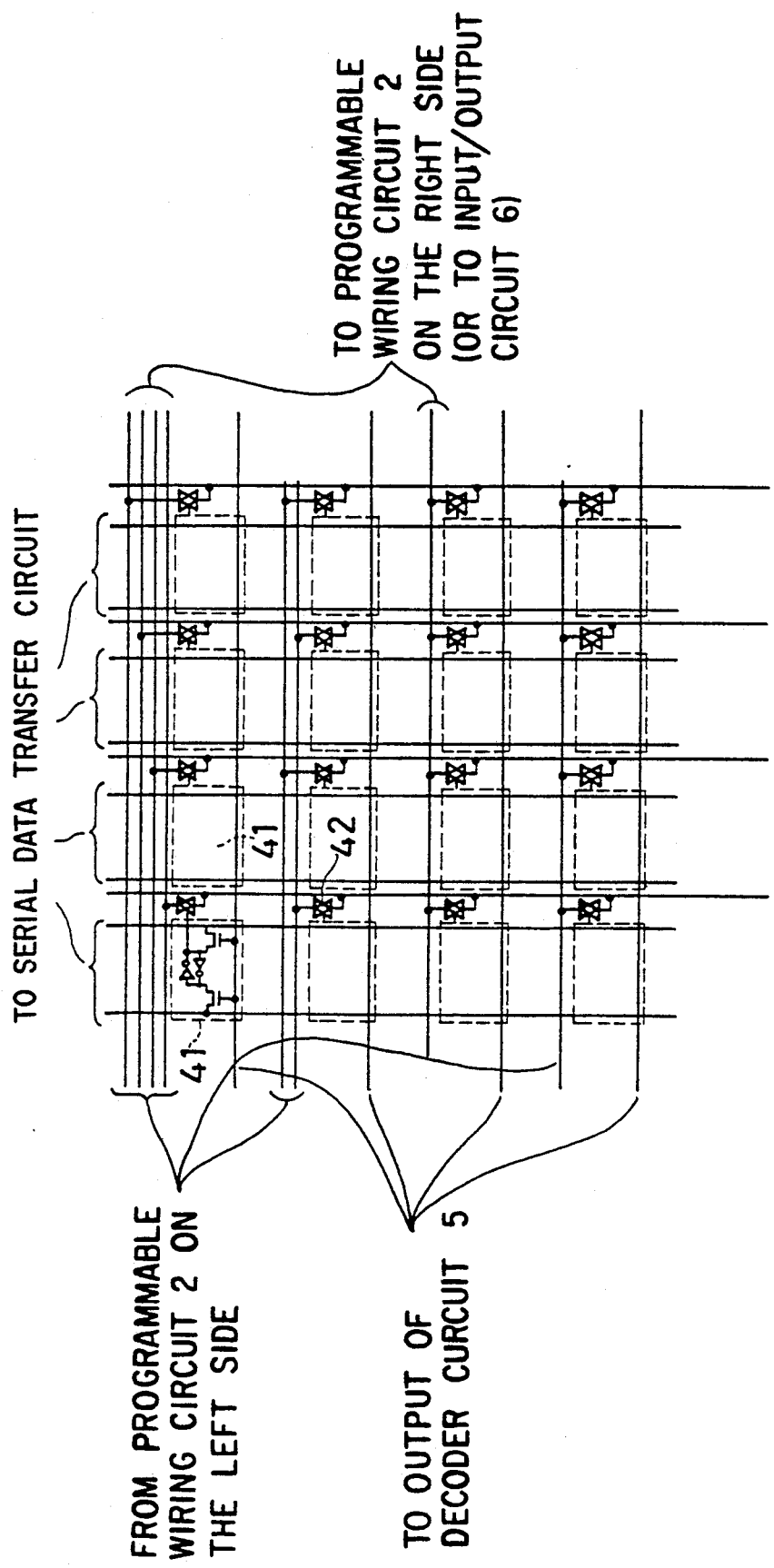

FIG. 4 shows the configuration of one of the fundamental programmable logic circuits 1, FIG. 5 shows the configuration of one of programmable wiring circuits 2, and FIG. 6 shows the configuration of one of programmable wiring circuits 3. With these programmable circuits 1-3 organically combined with one another, a desirable logical circuit according to the present invention is obtained. The programmable circuits 1-3 will be described in more detail below.

In the present embodiment, data-programmable flip-flop circuits ("21" in FIG. 4, "31" in FIG. 5, and "41" in FIG. 6) are arranged in a matrix pattern, so as to hold data. Each of these flip-flop circuits is of a 6-transistor type, just like a cell of a static RAM. In the present invention, however, it is not necessary to read data from each of the flip-flop circuits. It is only required that a data-holding voltage be applied to the output portion of a data storage section (i.e., flip-flop circuit 21, 31 or 41), so as to control a switch to be mentioned later. Since, therefore, the transistors employed in each flip-flop circuit are not particularly restricted in dimensions, the cells of the present invention can be made smaller than those of a RAM by integrating them in an integrated circuit. Thus, each flip-flop circuit may be replaced with a latch circuit, for example, if so desired. In the present embodiment, the flip-flop circuits are arranged in a matrix pattern, as in the case of a RAM. Bit lines, from which data is supplied, extend through the programmable wiring circuits and fundamental programmable logic circuits in the columnar direction, and is connected to the flip-flop circuits of the programmable wiring and logic circuits. Output lines of the decoder 5, which correspond to the word lines of a RAM, extend through the programmable circuits in the row direction, and are connected to the control electrodes of the data transfer gates of the flip-flop circuits of the programmable circuits. In FIGS. 4-6, the broken lines indicate the positions where the flip flop circuits are located. Since the flip-flop circuits are similar to another, FIGS. 4-6 do not show all of their circuit arrangements, for simplicity. Likewise, FIGS. 4-6 do not show all those circuit arrangements that are cyclically employed in the columnar and row directions.

In the example shown in FIG. 4, the fundamental programmable logic circuit is made by PLA (programmable logic array). The right half of FIG. 4 constitutes a product term circuit, while the left half thereof constitutes a sum term circuit. Part of the data to be input to the product term circuit is supplied from the programmable wiring circuit 2, and normal- and inverted-phase signals are supplied to the matrix circuit of the product term circuit. Basically, the product term circuit has the circuit arrangement of a NOR-ROM type. In order to bring the switch of a NOR circuit 22 at the intersection of input/output lines 29 into either an active state or an inactive state, an output of the flip-flop circuit 21, in which program data is written, is used. In the present embodiment, part of the flip-flop circuits of the product term circuit are used for programming the clock of the data-latch flip-flop circuits employed for an output of the PLA. An output of the product term circuit is supplied to the sum term circuit by way of a buffer 23. Like the product term circuit, the sum term circuit also has the circuit arrangement of a NOR-ROM type and contains NOR circuits 24 therein. The sum term circuit includes: flip-flops 21 each for controlling an exclusive NOR circuit 25 that controls the phase of an output (a normal phase or an inverted phase); and flip flop circuits 30 each for controlling a selection gate that controls whether an output should be latched in a D-type flip-flop circuit 26 or produced as it is. A final output of the sum term circuit is supplied to the programmable wiring circuit 2 by way of buffers (one-direction switches) 27 and 28. The circuit shown in FIG. 4 constitutes part of a logic circuit (LSI) which the present invention intends to provide.

FIG. 5 shows one of the programmable wiring circuits 2. As is shown in FIG. 5, lines connected directly to the input and output terminals of the fundamental programmable logic circuits 1 extend in the columnar direction, while lines for connection to the input and output terminals of the fundamental programmable logic circuits 1 and lines for connection to the programmable wiring circuits 3 extend in the row direction. The columnar-direction lines that are directly connected to the output terminals are connected to the row-direction lines by way of tri-state output buffers 32 each serving as a switch. With the tri-state buffers being rendered active or inactive in response to outputs of the flip-flop circuits 31, the lines connected between circuits 1 and 2 are programmed. The columnar-direction lines that are directly connected to the input terminals, tri-state buffers 32 are connected. By way of the tri-state buffers 32, the columnar-direction lines are connected to the row-direction lines. Each of the tri-state buffers can be formed as a bi-directional switch by means of a transmission gate, but, because of the buffer function, each tri-state buffer serves as an input/output buffer of a PLA circuit as well.

In the circuit shown in FIG. 5, the wiring lines can be programmed by providing a switch circuit to every one of the intersections between the columnar-direction and row-direction lines. If this is done, however, the number of flip-flop circuits required will be so large that a wide circuit area will be needed. In view of this problem, in the embodiment of the present invention, one row-direction array of flop-flops is associated with a plurality of row-direction wiring lines. With this circuit configuration, the degree of freedom for arrangement may be adversely affected more or less, but a high-density circuit arrangement is ensured instead. In the case shown in FIG. 5, the upper two row-directional arrays of flop-flops associate one array of flip-flop circuits with a plurality of wiring lines. Part of the row-direction lines are connected directly to the programmable wiring circuit 3 shown in FIG. 6. Some of the row-direction lines are connected also to the adjacent programmable wiring circuit 2 by way of the row-direction lines located in the middle portion of the programmable wiring circuit 3 shown in FIG. 6. From the configuration of circuits 1-3 shown in FIG. 1, it is understood that the connection mentioned above is readily attainable.

The programmable wiring circuit 3 shown in FIG. 6 is used for the programmable connection of the row-direction lines of programmable wiring circuits 2 that are arranged at different positions in the columnar direction. The programmable wiring circuit 3 has to employ bi-directional transmission gates 42 as switches since its signal transmission direction is not fixed or predetermined.

FIG. 7 shows an example of the input/output circuit 6 which constitutes an interface circuit arranged between the programmable logic circuit and an external circuit. In the input/output circuit 6, either input buffers 52 or output buffers 53 are selected in accordance with the type of signals (input signals or output signals) which are supplied through the row-direction lines connected to the row-direction lines of programmable wiring circuits 2 or 3. The selection between the input buffers 52 and output buffers 53 is made in accordance with the data stored in flip-flop circuits 51.

With the circuit arrangement mentioned above, the output terminal of one PLA (which corresponds to fundamental programmable logic circuit) can be connected to the input terminal of another PLA by means of two programmable wiring circuits 2 and one programmable wiring circuit 3. In addition, the parasitic resistance and capacitance are low due to the use of: feedback lines in a PLA, direct connection lines between adjacent PLAs, and small-load capacitance connection lines with a small number of switches 32 and 42. Accordingly, the programmable logic circuit achieves a high operation speed.

As regards the mapping performed by the programmable logic circuit of the present invention, one logic circuit desired by the user is allotted to a plurality of PLA circuits. This mapping technique is in wide use and within the general skill of the art. What has to be done after allotting the logic circuit to the PLA circuits is merely to connect the output and input terminals of the PLA circuits. The technique required for this connection is similar to the line layout technique for a gate array, so that the present invention allows easy mapping of a desirable logic circuit pattern. Since the mapping of the PLA circuits of the logic circuit and the programming of connection lines can be performed independently of each other and since the resistance of one connection line is low, the mapping is very easy to carry out.

Moreover, the circuits for executing the program, namely circuits 4 and 5, employ a single shift register and a single decoder and are therefore simple in arrangement. Thus, it is easy to additionally provide the program-executing circuits with the following: a counter for counting shift clocks (transfer clocks); a conversion circuit for converting the count of the counter into an address of an external memory; and a control circuit for supplying an enable signal to the decoder when the count of the counter is a predetermined value. With these additional structural elements added to the program-executing circuits, the logic circuit can be easily set up or programmed to perform a predetermined operation when it is turned on.

The present invention is not limited to the embodiment mentioned above and can be modified in various manners without departing from the spirit and scope of the invention. For example, the fundamental programmable logic circuit may be replaced with a PAL or a ROM, and the PLA circuit may be replaced with a circuit having a circuit arrangement other than that mentioned above. As long as a matrix-pattern circuit arrangement is employed, the advantages of the present invention are not adversely affected. In addition, the clocks for the circuits for latching output data need not be programmable, as in the embodiment mentioned above. They may be externally supplied in common to the latch circuits, so as to reduce the skew of clocks. Further, the latch circuits may be replaced with flip-flop circuits having a scan function, so as to carry out a scan test for the LSI. In the case where this replacement is done, the flip-flop circuits function as part of the data transfer circuit in the scan test mode, and function as ordinary D-type flip-flop circuits in the programming mode. Accordingly, the number of circuit elements can be reduced. Still further, in the programmable logic circuit of the above embodiment, the fundamental programmable logic circuits are made up of a plurality of PLAs, but the entirety of the programmable logic circuit of the invention may be made by fundamental programmable logic circuits, so as to obtain a programmable logic circuit of hierarchical structure. Even in this case, a single decoder and a single shift register are sufficient, provided that the flip-flop circuits are arranged in a matrix pattern.

As has been described, the present invention can provide a programmable logic circuit which enables easy mapping, permits a connection line to have a low resistance, and suitable for high integration.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A programmable logic circuit comprising:

a data transfer circuit for outputting serial program data in a parallel manner;

a plurality of fundamental programmable logic circuits each including first data storage sections arranged in a matrix pattern, said first data storage sections having signal output states which are programmed in accordance with parallel data supplied from the data transfer circuit, and a logic circuit pattern being programmed in accordance with at least outputs of the first data storage sections;

a plurality of programmable wiring means, arranged in adjacent to the fundamental programmable logic circuits, for providing connection lines between the fundamental programmable logic circuits, said programmable wiring means including second data storage sections arranged in a matrix pattern, said second data storage sections having signal output states which are programmed in accordance with the parallel data supplied from the data transfer circuit, and switches located between the connection lines being selected or controlled in accordance with outputs of the second storage sections;

a decoder circuit for causing the first and second storage sections to store data output from the data transfer circuit in response to address designation; and an input/output circuit for receiving and outputting a signal supplied through the fundamental programmable logic circuits and the programmable wiring means, at least said fundamental programmable logic circuits and said programmable wiring means being arranged in a matrix pattern.

2. A programmable logic circuit according to claim 1, wherein said programmable wiring means include first and second programmable wiring means selectively connected to each other by means of the switches and intersecting each other, and said second data storage sections are data storage sections additionally provided for the first and second programmable wiring means.

3. A programmable logic circuit according to claim 1, wherein said input/output circuit includes data storage sections which are arranged in a matrix pattern and which store data corresponding to an output of the data transfer circuit.

4. A programmable logic circuit according to claim 1, wherein said first and second data storage sections include flip-flop circuits.

5. A programmable logic circuit according to claim 1, wherein said decoder circuit has a disable terminal for disabling an output thereof.

6. A programmable logic circuit according to claim 1, wherein each of said switches is one of a one-direction switch and a bi-directional switch.

7. A programmable logic circuit according to claim 1, wherein the program data which is output by the data transfer circuit in a parallel manner is obtained from latch circuits used for latching parallel outputs of the data transfer circuit.

8. A programmable logic circuit according to claim 1, wherein said data transfer circuit, said fundamental programmable logic circuits, said programmable wiring means, said decoder circuit and said input/output circuit are fabricated as part of a large scale integrated circuit.

* * * * *